(12) United States Patent
Hong et al.

(10) Patent No.: US 7,282,451 B2
(45) Date of Patent: Oct. 16, 2007

(54) METHODS OF FORMING INTEGRATED CIRCUIT DEVICES HAVING METAL INTERCONNECT LAYERS THEREIN

(75) Inventors: Duk Ho Hong, Fishkill, NY (US); Kyoung Woo Lee, Fishkill, NY (US); Markus Naujok, Hopewell Junction, NY (US); Roman Knoefler, Fishkill, NY (US)

(73) Assignees: Samsung Electronics Co., Ltd. (KR); Infineon Technologies AG (DE)

( * ) Notice: Subject to any disclaimer, the term of this patent is extended or adjusted under 35 U.S.C. 154(b) by 122 days.

(21) Appl. No.: 11/216,686

(22) Filed: Aug. 31, 2005

(65) Prior Publication Data

US 2007/0045123 A1 Mar. 1, 2007

(51) Int. Cl.
*H01L 21/302* (2006.01)
(52) U.S. Cl. ............... 438/697; 438/700; 438/720; 438/736
(58) Field of Classification Search ........... 438/697, 438/700, 720, 736
See application file for complete search history.

(56) References Cited

U.S. PATENT DOCUMENTS

| 6,417,106 | B1 | 7/2002 | Twu et al. | |
|---|---|---|---|---|
| 6,569,770 | B2 | 5/2003 | Wang et al. | |
| 7,041,574 | B2 | 5/2006 | Kim et al. | |
| 7,115,517 | B2 * | 10/2006 | Ye et al. | 438/700 |
| 2003/0068880 | A1 * | 4/2003 | Morimoto et al. | 438/624 |
| 2005/0116348 | A1 * | 6/2005 | Minamihaba et al. | 257/758 |
| 2006/0024956 | A1 * | 2/2006 | Zhijian et al. | 438/637 |
| 2006/0065981 | A1 * | 3/2006 | Egusa | 257/774 |
| 2006/0110941 | A1 * | 5/2006 | Yen et al. | 438/781 |
| 2006/0223309 | A1 * | 10/2006 | Ho et al. | 438/652 |

FOREIGN PATENT DOCUMENTS

| JP | 100190079 B1 | 1/1999 |
|---|---|---|
| JP | 100278662 | 10/2000 |
| JP | 2000-3912 A | 7/2001 |
| JP | 1020020010814 A | 6/2002 |
| JP | 2002-305197 | 10/2002 |
| JP | 2003-092300 | 3/2003 |
| JP | 1020030092520 A | 12/2003 |
| JP | 100419021 | 2/2004 |
| JP | 1020040038139 A | 5/2004 |
| JP | 2004-253584 | 9/2004 |
| KR | 1020020076810 A | 10/2002 |
| KR | 1020020087741 A | 11/2002 |

* cited by examiner

*Primary Examiner*—Binh X. Tran
(74) *Attorney, Agent, or Firm*—Myers Bigel Sibley & Sajovec PA

(57) ABSTRACT

Methods of forming metal interconnect layers include forming an electrically insulating layer having a contact hole therein, on a semiconductor substrate and then forming a recess in the electrically insulating layer, at a location adjacent the contact hole. The contact hole and the recess are then filled with a first electrically conductive material (e.g., tungsten (W)). At least a portion of the first electrically conductive material within the contact hole is then exposed. This exposure occurs by etching back a portion of the electrically insulating layer using the first electrically conductive material within the contact hole and within the recess as an etching mask. The first electrically conductive material within the recess is then removed to expose another portion of the electrically insulating layer. Following this, the exposed portion of the first electrically conductive material is covered with a second electrically conductive material (e.g., copper (Cu)), which directly contacts the exposed portion of the first electrically conductive material. This covering step results in the definition of a wiring pattern including the first and second electrically conductive materials.

26 Claims, 5 Drawing Sheets

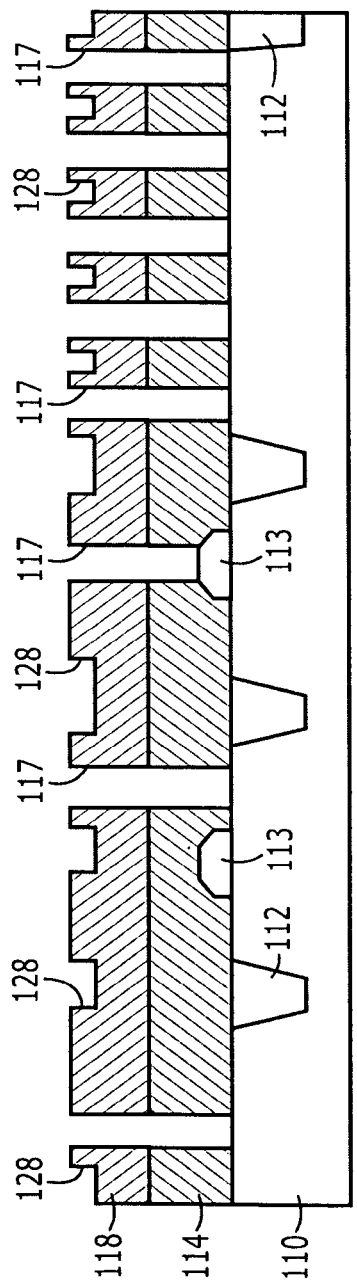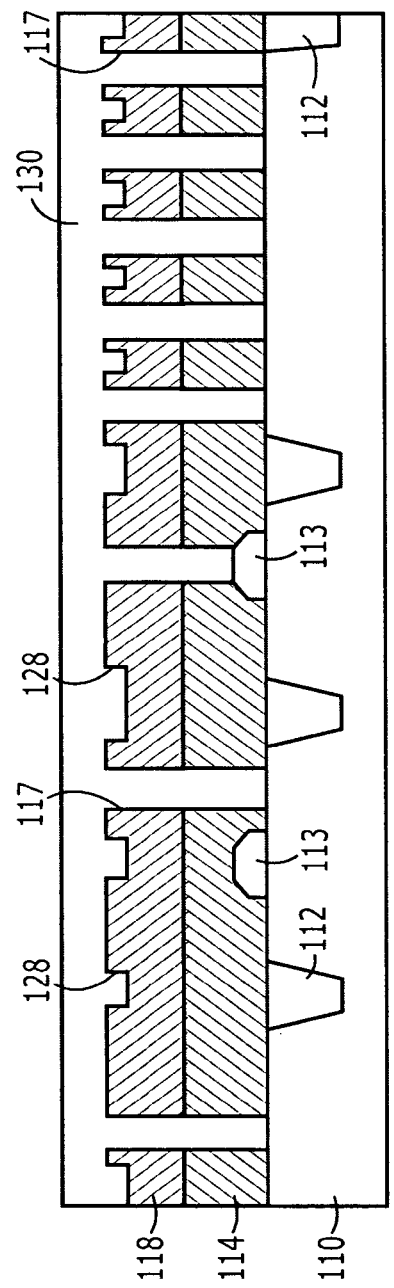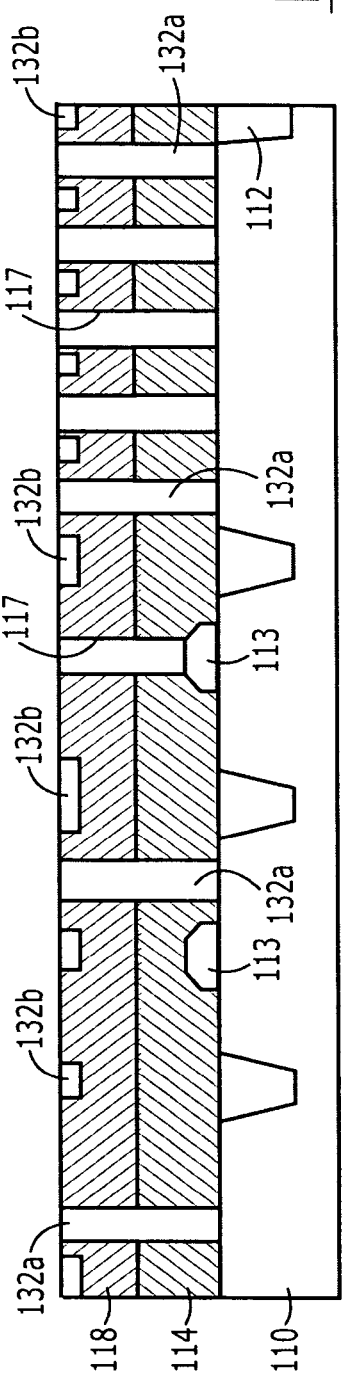

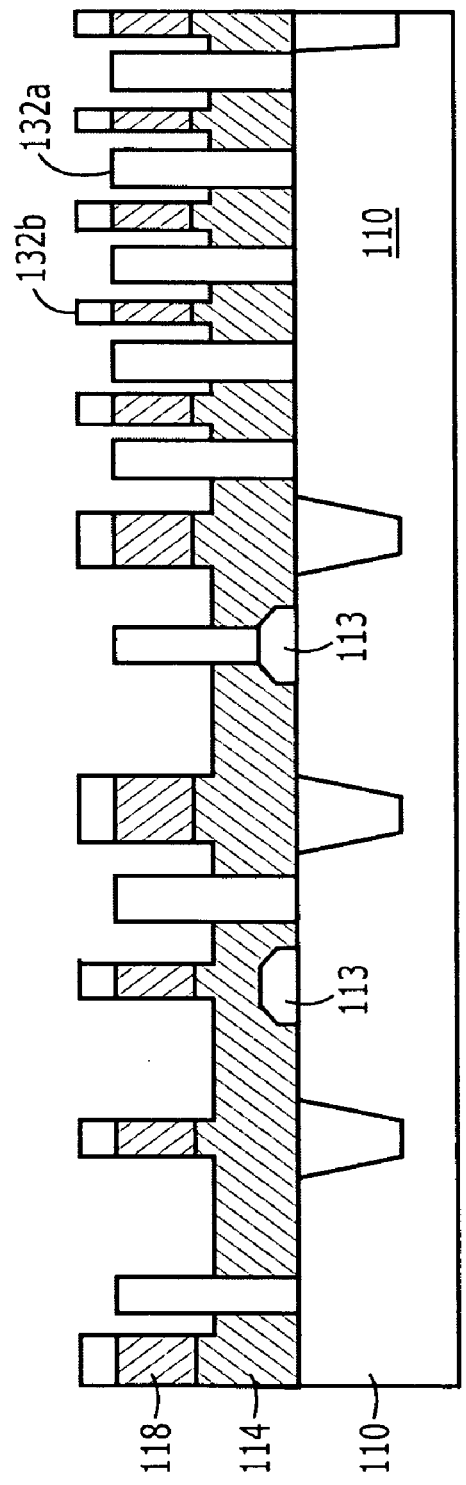
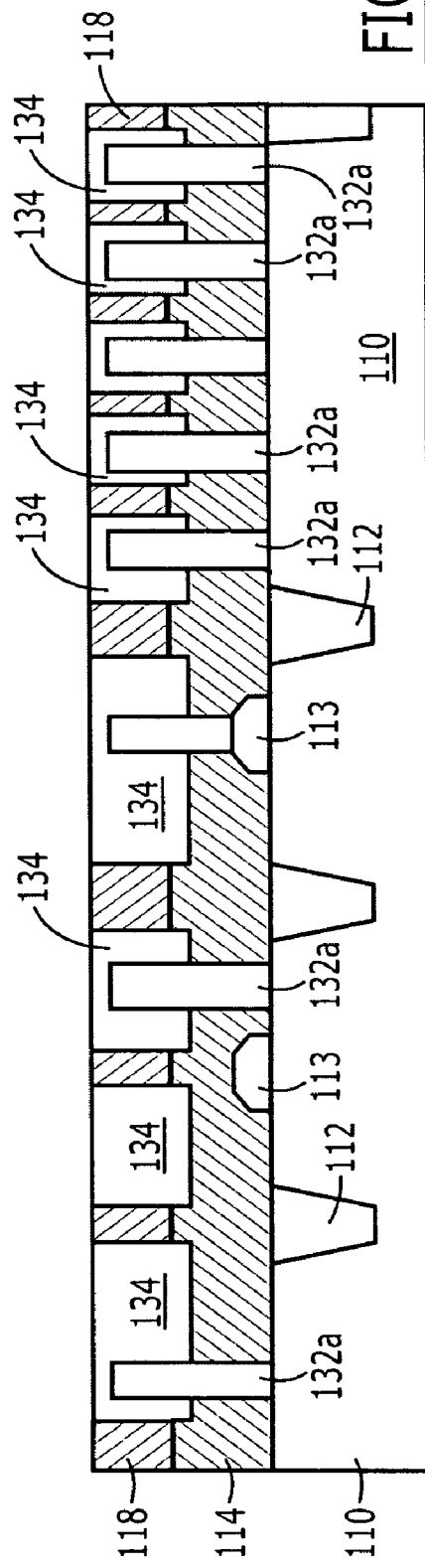

METHODS OF FORMING INTEGRATED CIRCUIT DEVICES HAVING METAL INTERCONNECT LAYERS THEREIN

FIELD OF THE INVENTION

The present invention relates to integrated circuit fabrication methods and, more particularly, to methods of fabricating integrated circuit devices having metal interconnect layers therein.

BACKGROUND OF THE INVENTION

Conventional methods of fabricating integrated circuit devices may utilize metal damascene process steps to define multi-layer metal interconnects on a semiconductor substrate. As illustrated by FIGS. 1A-1C, one conventional method may include forming a first electrically insulating layer 14 on a semiconductor substrate 10 having trench isolation regions 12 therein. This first electrically insulating layer 14 may be formed directly on a surface of the substrate 10 in order to provide a degree of passivation for underlying device structures (e.g., gate electrodes 13). The first electrically insulating layer 14 may be photolithographically patterned to define a plurality of contact holes 15 therein. As illustrated, the density of the contact holes 15 may vary with location on the substrate 10. After formation of the contact holes 15, a blanket layer 16 of a first electrically conductive material (e.g., tungsten (W)) may be conformally deposited on the first electrically insulating layer 14.

As illustrated by FIG. 1B, this blanket layer 16 may be planarized for a sufficient duration to expose the first electrically insulating layer 14 and thereby define a first plurality of conductive vias 16a, 16b and 16c. This planarization step may be performed as a conventional chemical-mechanical polishing (CMP) step using a polishing apparatus in combination with a slurry solution that is applied to an upper surface of the blanket layer 16 during polishing. Unfortunately, during polishing, a "dishing" phenomenon may result in an excessive recession of the first electrically insulating layer 14 opposite those portions of the substrate 10 containing a relatively high density of conductive vias 16c. Thereafter, as illustrated by FIG. 1C, a second electrically insulating layer 18 may be deposited on the structure of FIG. 1B and then patterned to define openings therein that are aligned with the conductive vias 16a, 16b and 16c. Next, a blanket layer of a second electrically conductive material (e.g., copper (Cu)) may be conformally deposited on the second electrically insulating layer 18. This blanket layer may then be planarized using CMP to define a second plurality of conductive lines 20a, 20b, 20c and 20d. Unfortunately, because of the excessive recession of the first electrically insulating layer 14 illustrated by FIG. 1B, the planarization of the second electrically conductive material may result in the formation of a relatively wide metal line 20d that electrically shorts adjacent conductive vias 16c together. This relatively wide metal line 20d represents a metal defect (e.g., metal line short) that may significantly reduce device yield after back-end processing steps have been completed.

SUMMARY OF THE INVENTION

Embodiments of the invention include methods of forming integrated circuit devices using metal damascene process steps. According to some of these embodiments, the methods are provided by forming an electrically insulating layer having a contact hole therein, on a semiconductor substrate and then forming a recess in the electrically insulating layer, at a location adjacent the contact hole. The contact hole and the recess are then filled with a first electrically conductive material (e.g., tungsten (W)). At least a portion of the first electrically conductive material within the contact hole is then exposed. This exposure occurs by etching back a portion of the electrically insulating layer using the first electrically conductive material within the contact hole and within the recess as an etching mask. The first electrically conductive material within the recess is then removed to expose another portion of the electrically insulating layer. Following this, the exposed portion of the first electrically conductive material is covered with a second electrically conductive material (e.g., copper (Cu)), which directly contacts the exposed portion of the first electrically conductive material. This covering step results in the definition of a wiring pattern including the first and second electrically conductive materials. In particular, the covering step may include depositing a layer of metallization directly on the exposed portion of the first electrically conductive material and then planarizing the deposited layer of metallization for a sufficient duration to expose the electrically insulating layer.

According to further aspects of these embodiments, the step of forming a recess in the electrically insulating layer may include etching the recess into the electrically insulating layer using a photolithographically patterned layer as an etching mask. In this case, the step of etching the recess may be preceded by a step of depositing a spin-on-glass layer into the contact hole and onto the electrically insulating layer. This step of depositing a spin-on-glass layer is followed by the steps of depositing an anti-reflecting coating on the spin-on-glass layer and depositing a photoresist layer on the anti-reflective coating. This step of depositing a photoresist layer may then be followed by the steps of patterning the photoresist layer and etching the spin-on-glass layer using the patterned photoresist layer as an etching mask.

According to further embodiments of the invention, methods of forming integrated circuit devices using metal damascene process steps forming an electrically insulating layer having a contact hole therein, on a semiconductor substrate and then forming a recess in the electrically insulating layer, at a location adjacent the contact hole. The contact hole and the recess are then filled with a first electrically conductive material (e.g., tungsten (W)). At least a portion of the first electrically conductive material within the contact hole is then exposed. This exposure occurs by etching back a portion of the electrically insulating layer using the first electrically conductive material within the contact hole and within the recess as an etching mask. The first electrically conductive material within the recess is then removed to expose another portion of the electrically insulating layer. Following this, the exposed portion of the first electrically conductive material and the first electrically conductive material within the recess is covered with a second electrically conductive material (e.g., copper (Cu)), which directly contacts the exposed portion of the first electrically conductive material. The second electrically conductive material is then planarized for a sufficient duration to remove the first electrically conductive material within the recess and define a wiring pattern including the first and second electrically conductive materials. According to further aspects of these embodiments, the step of filling the contact hole and the recess with a first electrically conductive material includes depositing a first electrically conductive layer that extends into the first contact hole and into the first recess, on the electrically insulating layer and then planarizing the first electrically conductive layer for a sufficient duration to expose the electrically insulating layer and define an electrically conductive plug within the contact hole and a dummy metal pattern within the recess.

According to still further embodiments of the invention, methods of forming integrated circuit devices include forming a first electrically insulating layer on a semiconductor substrate and then forming a second electrically insulating layer on the first electrically insulating layer. A first contact hole is then formed. This first contact hole extends through the first and second electrically insulating layers. Thereafter, a first recess is formed in the second electrically insulating layer, at a location adjacent the first contact hole. The first contact hole and the first recess are then filled with a first electrically conductive material (e.g., tungsten). At least a portion of the first electrically conductive material within the first contact hole is then exposed by etching back a portion of the second electrically insulating layer using the first electrically conductive material within the first contact hole and within the first recess as an etching mask. The exposed portion of the first electrically conductive material is then covered with a second electrically conductive material (e.g., copper) to thereby define a wiring pattern. This wiring pattern includes the first and second electrically conductive materials.

According to further aspects of these embodiments, the step of filling the first contact hole and the first recess with a first electrically conductive material includes depositing a first electrically conductive layer that extends into the first contact hole and into the first recess, on the second electrically insulating layer. Thereafter, the first electrically conductive layer is planarized for a sufficient duration to expose the second electrically insulating layer. This planarization step includes planarizing the first electrically conductive layer for a sufficient duration to thereby define an electrically conductive plug within the first contact hole and a dummy metal pattern within the first recess.

The covering step may also be preceded by the step of removing the dummy metal pattern to expose another portion of the second electrically insulating layer. In particular, this removing step includes etching back the dummy metal pattern within the first recess and simultaneously etching back a portion of the electrically conductive plug within the first contact hole. Alternatively, the covering step may include depositing a layer of metallization (e.g., copper metallization) on the electrically conductive plug and on the dummy metal pattern and then planarizing the layer of metallization for a sufficient duration to remove the dummy metal pattern and expose another portion of the second electrically insulating layer.

BRIEF DESCRIPTION OF THE DRAWINGS

FIGS. 2A-2G are cross-sectional views of intermediate structures that illustrate methods of forming metal interconnect layers according to embodiments of the present invention.

DETAILED DESCRIPTION OF PREFERRED EMBODIMENTS

Figure 1A:
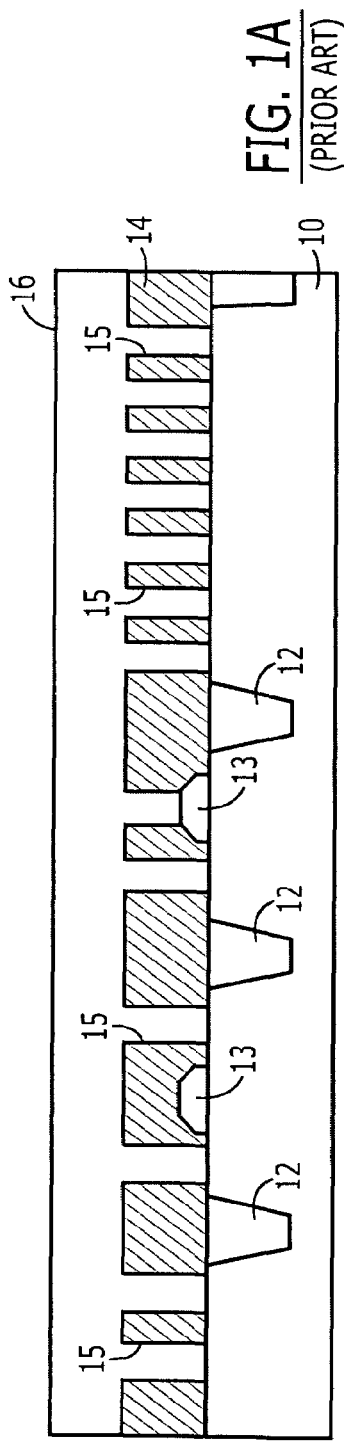
FIGS. 1A-1C are cross-sectional views of intermediate structures that illustrate conventional methods of forming metal interconnect layers using damascene process steps.
Figure 1B:
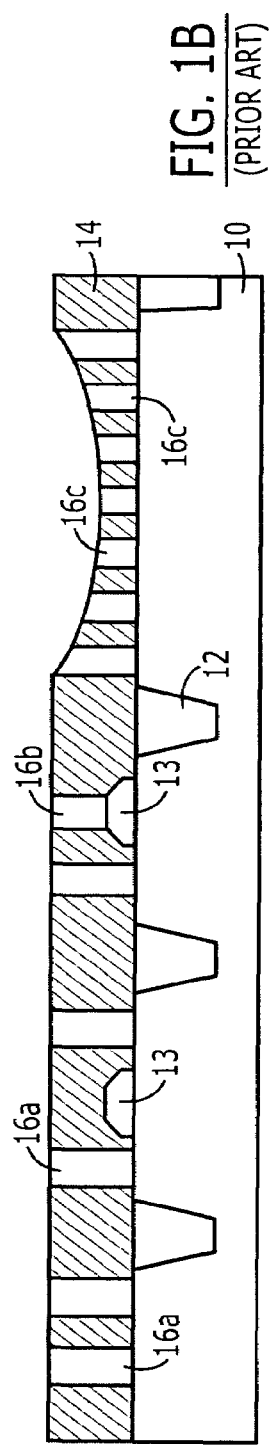
Figure 1C:
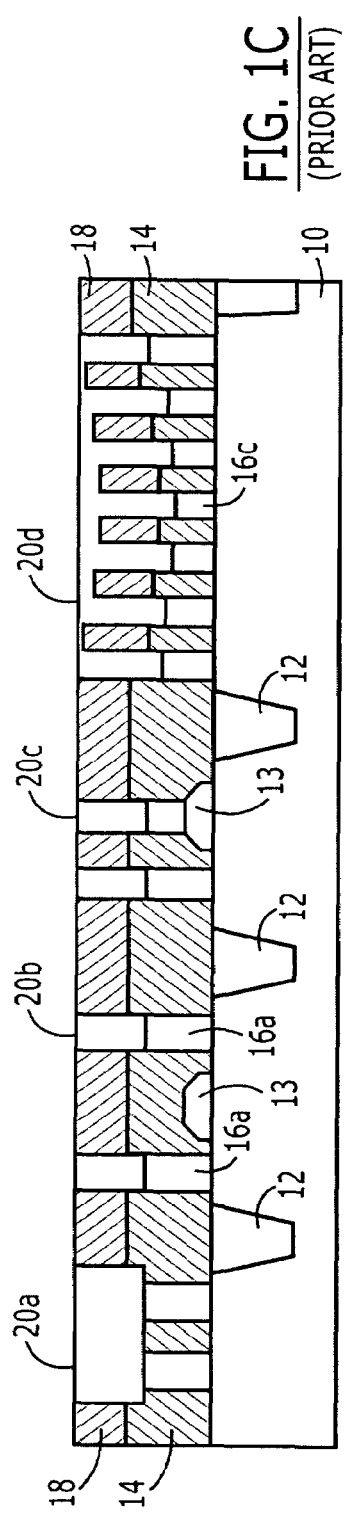

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 2A:
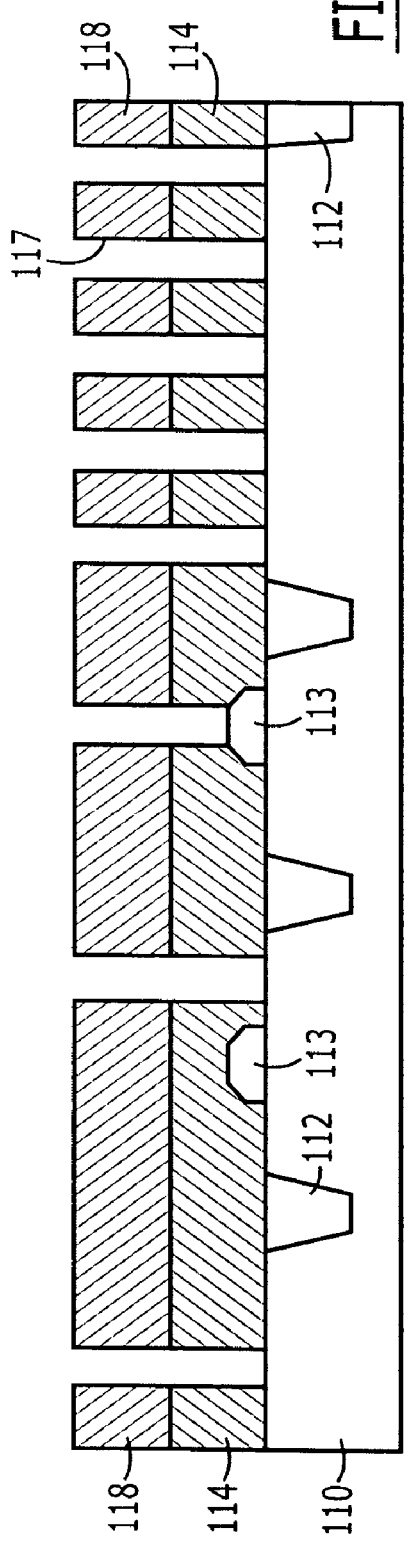

Referring now to FIG. 2A, methods of forming metal interconnect layers according to some embodiments of the invention include steps to form a first electrically insulating layer 114 on a semiconductor substrate 110. As illustrated, the semiconductor substrate 110 may be an integrated circuit substrate having a plurality of trench isolation regions 112 therein and a plurality of device structures 113 (e.g., gate electrodes) thereon. This first electrically insulating layer 114 may be a silicon dioxide layer having a thickness in a range from about 2,000 Å to about 4,000 Å, however, a layer 114 having a thickness less than 2,000 Å or greater than 4,000 Å is also possible. The first electrically insulating layer 114 is then covered with a second electrically insulating layer 118. This second electrically insulating layer 118 may be formed by depositing an electrically insulating material having a relatively low dielectric constant, such as SiCOH or SiLK™, which is an aromatic hydrocarbon polymer having a dielectric constant of about 2.65. The second electrically insulating layer 118 may be formed to have a thickness in a range from about 1,500 Å to about 2,000 Å, however, other thicknesses are also possible. The first and second electrically insulating layers 114 and 118, respectively, are then patterned to define a plurality of contact holes 117 therein. These contact holes 117, which may be etched using a photolithographically defined mask (not shown), may extend completely through the first electrically insulating 114 and expose an upper surface of the semiconductor substrate 110 and/or one or more of the device structures 113.

Figure 2B:
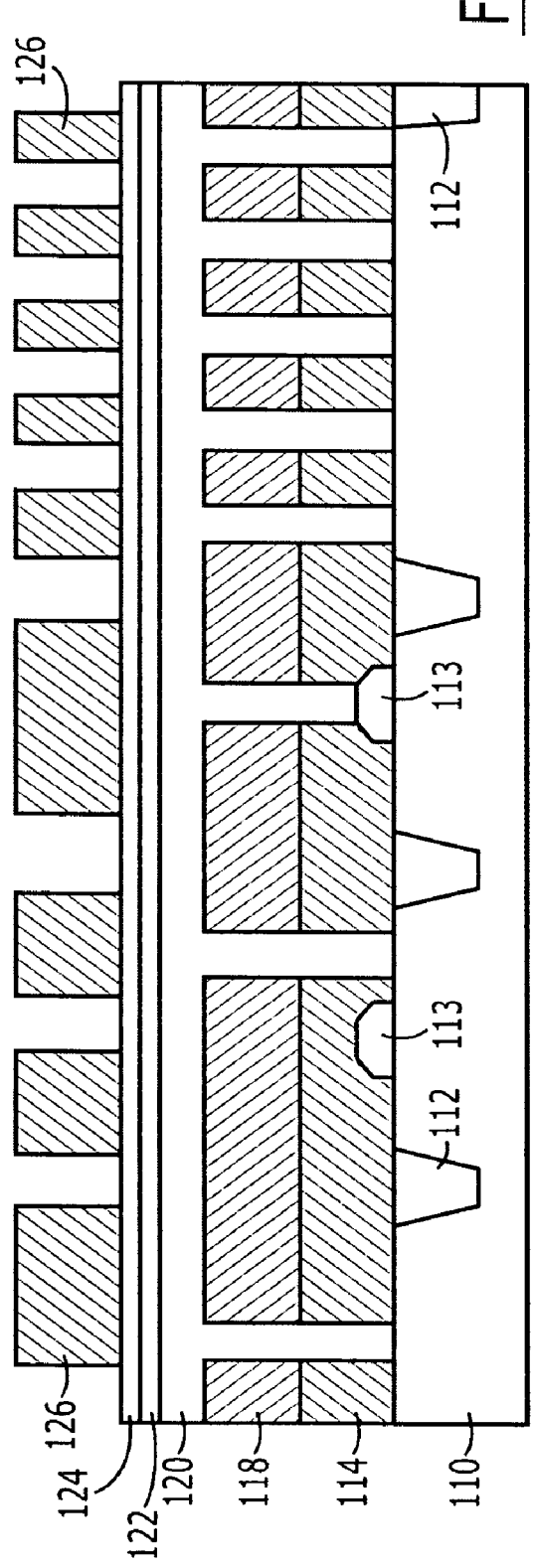

Referring now to FIG. 2B, a spin-on-glass (SOG) layer 120 is conformally applied to thereby fill the plurality of contact holes 117 and uniformly coat an upper surface of the second electrically insulating layer 118. As will be understood by those skilled in the art, the SOG layer 120 may be used to achieve a high degree of surface planarity so that high precision photolithography steps may be subsequently performed. These high precision photolithography steps may include the sequential deposition of a low temperature oxide (LTO) layer 122 and an anti-reflective coating 124. Thereafter, a layer of photoresist may be deposited and patterned to define a reverse-image photoresist mask 126. This mask 126 may be configured to have openings therein that extend opposite upper surface portions of the second electrically insulating layer 118, which are closely adjacent the contact holes 117.

As illustrated by FIG. 2C, an etching step(s) (e.g., reactive ion etching (RIE)) may then be performed to selectively etch through the anti-reflective coating 124, the low temperature oxide layer 122, the SOG layer 120 and the upper surface of the second electrically insulating layer 118, in sequence, to define a plurality of recesses 128 within the upper surface of the second electrically insulating layer 118. These recesses 128 may have a depth of about 500-1000 Å. Remaining portions of the SOG layer 120 are then removed from the plurality of contact holes 117, as illustrated. Referring now to FIGS. 2D-2E, the contact holes 117 and recesses 128 are then filled with a first electrically conductive material. In particular, a blanket layer of metal 130 (e.g., tungsten (W)) may be conformally deposited onto the second electrically insulating layer 118 and into the contact holes 117. This blanket layer of metal 130 may have a thickness in a range from about 1000 Å to about 5000 Å. The blanket layer of metal 130 is then planarized by chemical-mechanical polishing the blanket layer of metal 130 for a sufficient duration to expose the upper surface of the second electrically insulating layer 118 and thereby define a plurality of electrically conductive plugs 132a within the contact holes 117 and a plurality of dummy metal patterns 132b within the plurality of recesses 128.

Referring now to FIG. 2F, a reactive ion etching (RIE) step is performed to directionally etch back exposed portions of the second electrically insulating layer 118, using the electrically conductive plugs 132a and the dummy metal patterns 132b as an etching mask. As illustrated, this RIE step may be performed for a sufficient duration to expose (and possibly etch back) an upper surface of the first electrically insulating layer 114. Thereafter, as illustrated by FIG. 2G, a second blanket layer of a metal (e.g., copper (Cu) or tungsten (W)) is deposited on the resulting structure of FIG. 2F and then planarized (e.g., by chemical-mechanical polishing) for a sufficient duration to remove the dummy metal patterns 132b and expose underlying portions of the second electrically insulating layer 118. The second blanket layer of metal may have a thickness in a range from about 4000 Å to about 9000 Å. The resulting regions of the second electrically insulating layer 118 that extend between adjacent conductive plugs 132a operate to electrically isolate adjacent metal wiring patterns from each other. Each of these wiring patterns includes a respective conductive plug 132a with a covering metal pattern 134 (e.g, copper cap) derived from the second layer of metal. Subsequent process and packaging steps (not shown) may then be performed to complete an integrated circuit device having one or more layers of metallization formed from the process steps described herein.

Figure 3A:
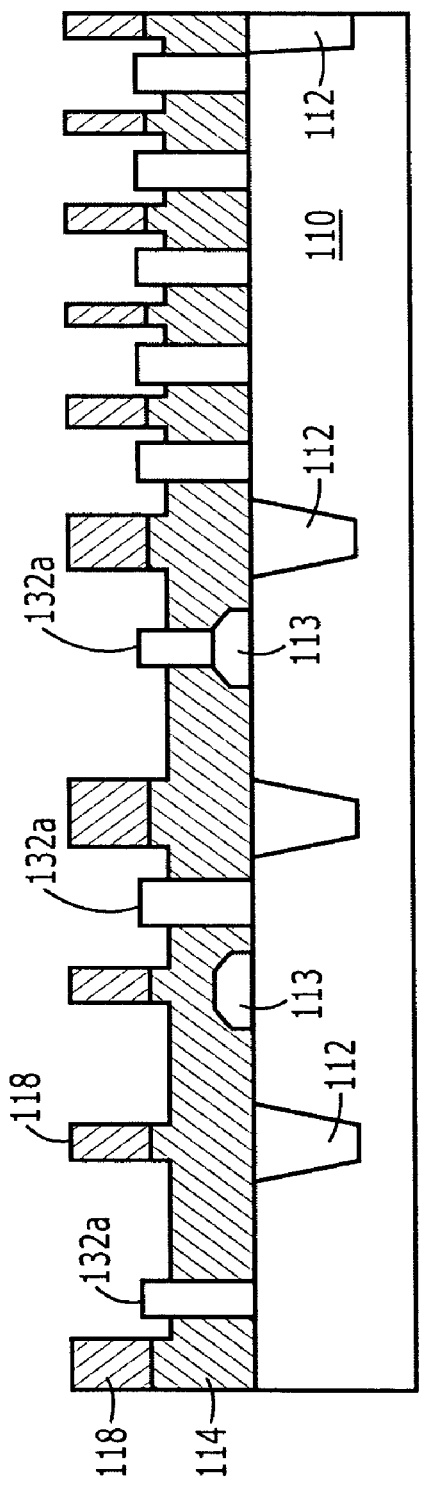
FIGS. 3A-3B are cross-sectional views of intermediate structures that illustrate alternative process steps to those illustrated by FIGS. 2F-2G, according to embodiments of the present invention.
Figure 3B:
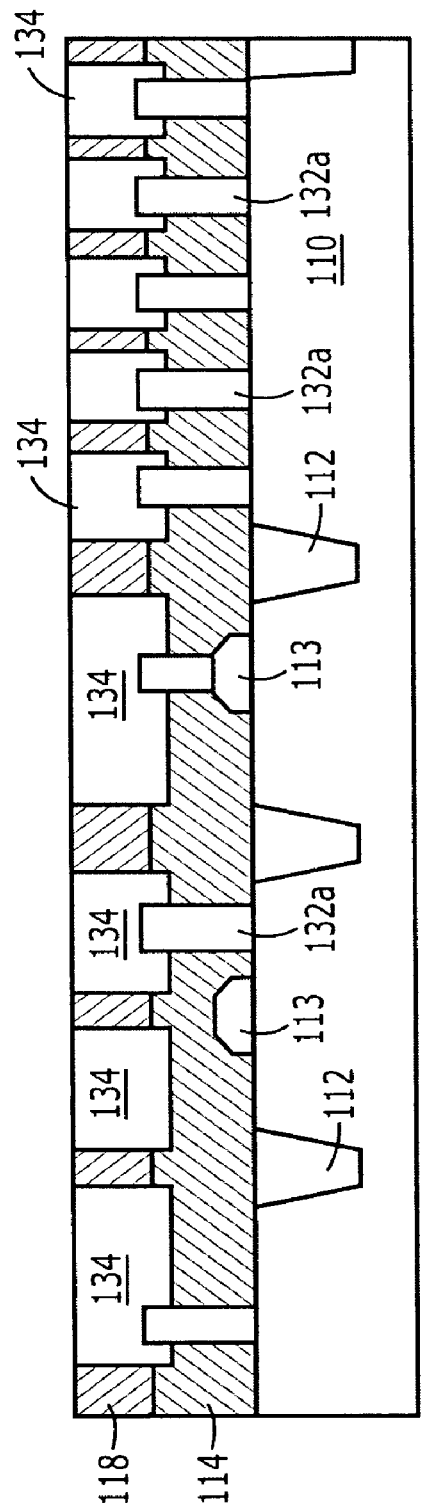

According to additional embodiments of the invention, the steps illustrated and described above with respect to FIGS. 2F-2G may be replaced by the steps of FIGS. 3A-3B. In particular, FIG. 3A illustrates the performance of a reactive ion etching (RIE) step to directionally etch back exposed portions of the second electrically insulating layer 118, using the electrically conductive plugs 132a and the dummy metal patterns 132b as an etching mask. As illustrated, this RIE step may be performed for a sufficient duration to expose (and possibly etch back) an upper surface of the first electrically insulating layer 114. Thereafter, an additional etching step (wet or dry etch) is performed to etch back (i.e., shorten) the conductive plugs 132a and remove the dummy metal patterns 132b. Then, as illustrated by FIG. 3B, a second blanket layer of a metal (e.g., copper (Cu)) is deposited on the resulting structure of FIG. 3A and then planarized (e.g., by chemical-mechanical polishing) for a sufficient duration to expose underlying portions of the second electrically insulating layer 118. The resulting regions of the second electrically insulating layer 118 that extend between adjacent conductive plugs 132a operate to electrically isolate adjacent metal wiring patterns from each other. Each of these wiring patterns includes a respective conductive plug 132a with a covering metal pattern 134 (e.g, copper cap) derived from the second layer of metal.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit device, comprising the steps of:
    forming a first electrically insulating layer on a semiconductor substrate;
    forming a second electrically insulating layer on the first electrically insulating layer;
    forming a first contact hole that extends through the first and second electrically insulating layers; then
    forming a first recess in the second electrically insulating layer, at a location adjacent the first contact hole;
    filling the first contact hole and the first recess with a first electrically conductive material;
    exposing at least a portion of the first electrically conductive material within the first contact hole by etching back a portion of the second electrically insulating layer using the first electrically conductive material within the first contact hole and within the first recess as an etching mask; and
    covering the exposed portion of the first electrically conductive material with a second electrically conductive material to thereby define a wiring pattern comprising the first and second electrically conductive materials.

2. The method of claim 1, wherein said step of filling the first contact hole and the first recess with a first electrically conductive material comprises the steps of:
    depositing a first electrically conductive layer that extends into the first contact hole and into the first recess, on the second electrically insulating layer; and
    planarizing the first electrically conductive layer for a sufficient duration to expose the second electrically insulating layer.

3. The method of claim 2, wherein said planarizing step comprises planarizing the first electrically conductive layer to thereby define an electrically conductive plug within the first contact hole and a dummy metal pattern within the first recess.

4. The method of claim 3, wherein said covering step comprises:
    depositing the second electrically conductive material as a layer of metallization on the electrically conductive plug and on the dummy metal pattern; and
    planarizing the layer of metallization for a sufficient duration to remove the dummy metal pattern and expose another portion of the second electrically insulating layer.

5. The method of claim 3, wherein said covering step is preceded by the step of removing the dummy metal pattern to expose another portion of the second electrically insulating layer.

6. The method of claim 5, wherein said removing step comprises etching back the dummy metal pattern within the first recess and simultaneously etching back a portion of the electrically conductive plug within the first contact hole.

7. The method of claim 1, wherein said step of forming a first recess in the second electrically insulating layer comprises:

etching the first recess into the second electrically insulating layer using a photolithographically patterned layer as an etching mask.

8. The method of claim 7, wherein said step of etching the first recess is preceded by a step of depositing a spin-on-glass layer into the first contact hole and onto the second electrically insulating layer; wherein said step of etching the first recess includes etching through the spin-on-glass layer; and wherein said step of filling the first contact hole and the first recess is preceded by a step of removing the spin-on-glass layer from the first contact hole.

9. The method of claim 8, wherein said step of depositing a spin-on-glass layer is followed by the steps of:
depositing an anti-reflecting coating on the spin-on-glass layer; and
depositing a photoresist layer on the anti-reflective coating.

10. The method of claim 9, wherein said step of depositing an anti-reflecting coating is preceded by a step of depositing an oxide layer on the spin-on-glass layer; and wherein said step of depositing an anti-reflecting coating comprises depositing an anti-reflective coating on the oxide layer.

11. The method of claim 9, wherein said step of depositing a photoresist layer is followed by the steps of patterning the photoresist layer and then etching the spin-on-glass layer using the patterned photoresist layer as an etching mask.

12. A method of forming an integrated circuit device, comprising the steps of:
forming an electrically insulating layer having a contact hole therein, on a semiconductor substrate;
forming a recess in the electrically insulating layer, at a location adjacent the contact hole;
filling the contact hole and the recess with a first electrically conductive material;
exposing at least a portion of the first electrically conductive material within the contact hole by etching back a portion of the electrically insulating layer using the first electrically conductive material within the contact hole and within the recess as an etching mask;
removing the first electrically conductive material within the recess to expose another portion of the electrically insulating layer; and then
covering the exposed portion of the first electrically conductive material with a second electrically conductive material to thereby define a wiring pattern comprising the first and second electrically conductive materials.

13. The method of claim 12, wherein said covering step comprises depositing the second electrically conductive material as a layer of metallization directly on the exposed portion of the first electrically conductive material and then planarizing the deposited layer of metallization for a sufficient duration to expose the electrically insulating layer.

14. The method of claim 12, wherein said step of forming a recess in the electrically insulating layer comprises:
etching the recess into the electrically insulating layer using a photolithograph ically patterned layer as an etching mask.

15. The method of claim 14, wherein said step of etching the recess is preceded by a step of depositing a spin-on-glass layer into the contact hole and onto the electrically insulating layer; wherein said step of etching the recess includes etching through the spin-on-glass layer; and wherein said step of filling the contact hole and the recess is preceded by a step of removing the spin-on-glass layer from the contact hole.

16. The method of claim 15, wherein said step of depositing a spin-on-glass layer is followed by the steps of:
depositing an anti-reflecting coating on the spin-on-glass layer; and
depositing a photoresist layer on the anti-reflective coating.

17. The method of claim 16, wherein said step of depositing an anti-reflecting coating is preceded by a step of depositing an oxide layer on the spin-on-glass layer; and wherein said step of depositing an anti-reflecting coating comprises depositing an anti-reflective coating on the oxide layer.

18. The method of claim 16, wherein said step of depositing a photoresist layer is followed by the steps of patterning the photoresist layer and then etching the spin-on-glass layer using the patterned photoresist layer as an etching mask.

19. A method of forming an integrated circuit device, comprising the steps of:
forming an electrically insulating layer having a contact hole therein, on a semiconductor substrate;
forming a recess in the electrically insulating layer, at a location adjacent the contact hole;
filling the contact hole and the recess with a first electrically conductive material;
exposing at least a portion of the first electrically conductive material within the contact hole by etching back a portion of the electrically insulating layer using the first electrically conductive material within the contact hole and within the recess as an etching mask;
covering the exposed portion of the first electrically conductive material and the first electrically conductive material within the recess with a second electrically conductive material; and
planarizing the second electrically conductive material for a sufficient duration to remove the first electrically conductive material within the recess and define a wiring pattern comprising the first and second electrically conductive materials.

20. The method of claim 19, wherein said step of filling the contact hole and the recess with a first electrically conductive material comprises the steps of:
depositing a first electrically conductive layer that extends into the first contact hole and into the first recess, on the electrically insulating layer; and
planarizing the first electrically conductive layer for a sufficient duration to expose the electrically insulating layer and define an electrically conductive plug within the contact hole and a dummy metal pattern within the recess.

21. The method of claim 19, wherein the first electrically conductive material is the same as the second electrically conductive material.

22. The method of claim 19, wherein said step of forming a recess in the electrically insulating layer comprises:
etching the recess into the electrically insulating layer using a photolithographically patterned layer as an etching mask.

23. The method of claim 22, wherein said step of etching the recess is preceded by a step of depositing a spin-on-glass layer into the contact hole and onto the electrically insulating layer; wherein said step of etching the recess includes etching through the spin-on-glass layer; and wherein said step of filling the contact hole and the recess is preceded by a step of removing the spin-on-glass layer from the contact hole.

24. The method of claim 23, wherein said step of depositing a spin-on-glass layer is followed by the steps of:
  depositing an anti-reflecting coating on the spin-on-glass layer; and
  depositing a photoresist layer on the anti-reflective coating.

25. The method of claim 24, wherein said step of depositing an anti-reflecting coating is preceded by a step of depositing an oxide layer on the spin-on-glass layer; and wherein said step of depositing an anti-reflecting coating comprises depositing an anti-reflective coating on the oxide layer.

26. The method of claim 24, wherein said step of depositing a photoresist layer is followed by the steps of patterning the photoresist layer and then etching the spin-on-glass layer using the patterned photoresist layer as an etching mask.

* * * * *

UNITED STATES PATENT AND TRADEMARK OFFICE
CERTIFICATE OF CORRECTION

PATENT NO. : 7,282,451 B2  Page 1 of 1
APPLICATION NO. : 11/216686
DATED : October 16, 2007
INVENTOR(S) : Hong et al.

It is certified that error appears in the above-identified patent and that said Letters Patent is hereby corrected as shown below:

Column 7, Line 58: Please correct "photolithograph ically"
                   To read -- photolithographically --

Column 8, Line 64: Please correct "wherein said of etching"
                   To read -- wherein said step of etching --

Signed and Sealed this

Twenty-fifth Day of December, 2007

JON W. DUDAS
*Director of the United States Patent and Trademark Office*